(12) United States Patent
Dietz

(10) Patent No.: US 10,358,743 B2
(45) Date of Patent: Jul. 23, 2019

(54) HIGH PRESSURE CHEMICAL VAPOR DEPOSITION APPARATUSES, METHODS, AND COMPOSITIONS PRODUCED THEREWITH

(71) Applicant: Georgia State University Research Foundation, Inc., Atlanta, GA (US)

(72) Inventor: Nikolaus Dietz, Tucker, GA (US)

(73) Assignee: Georgia State University Research Foundation, Inc., Atlanta, GA (US)

( * ) Notice: Subject to any disclaimer, the term of this patent is extended or adjusted under 35 U.S.C. 154(b) by 549 days.

(21) Appl. No.: 14/982,132

(22) Filed: Dec. 29, 2015

(65) Prior Publication Data

US 2016/0138191 A1 May 19, 2016

Related U.S. Application Data

(63) Continuation of application No. 13/390,055, filed as application No. PCT/US2010/045329 on Aug. 12, 2010, now Pat. No. 9,243,329.
(Continued)

(51) Int. Cl.
| | |
|---|---|
| *C30B 25/14* | (2006.01) |
| *H01L 21/02* | (2006.01) |
| *H01L 33/32* | (2010.01) |
| *C23C 16/455* | (2006.01) |
| *C23C 16/458* | (2006.01) |

(Continued)

(52) U.S. Cl.
CPC ............ *C30B 25/14* (2013.01); *C23C 16/303* (2013.01); *C23C 16/4584* (2013.01); *C23C 16/45502* (2013.01); *C23C 16/45523* (2013.01); *C23C 16/45544* (2013.01); *C23C 16/52* (2013.01); *C30B 25/165* (2013.01); *C30B 29/403* (2013.01); *G05D 11/135* (2013.01); *H01L 21/0254* (2013.01); *H01L 33/32* (2013.01)

(58) Field of Classification Search
CPC ......... C30B 25/02; C30B 25/08; C30B 25/14; C30B 23/06
See application file for complete search history.

(56) References Cited

U.S. PATENT DOCUMENTS

| | | | |
|---|---|---|---|
| 3,608,519 A | 9/1971 | Bean et al. | |
| 3,675,619 A | 7/1972 | Burd | |

(Continued)

FOREIGN PATENT DOCUMENTS

| | | | |
|---|---|---|---|
| JP | 06-216030 A | 8/1994 | |
| JP | 07-235505 A | 9/1995 | |

(Continued)

OTHER PUBLICATIONS

Cardelino, B.H. et al., "Advanced Computational Modeling of Vapor Deposition in a High-Pressure Reactor," CAITA-2004, Purdue University, Jun. 2004, ISBN 86-7466-117-3.
(Continued)

*Primary Examiner* — Robert M Kunemund
(74) *Attorney, Agent, or Firm* — Eversheds Sutherland (US) LLP

(57) ABSTRACT

A composition, reactor apparatus, method, and control system for growing epitaxial layers of group III-nitride alloys. Super-atmospheric pressure is used as a process parameter to control the epitaxial layer growth where the identity of alloy layers differ within a heterostructure stack of two or more layers.

12 Claims, 12 Drawing Sheets

Related U.S. Application Data

(60) Provisional application No. 61/233,238, filed on Aug. 12, 2009.

(51) Int. Cl.

| | | |
|---|---|---|
| *C30B 29/40* | (2006.01) | |
| *C23C 16/30* | (2006.01) | |
| *C23C 16/52* | (2006.01) | |
| *C30B 25/16* | (2006.01) | |
| *G05D 11/13* | (2006.01) | |

(56) References Cited

U.S. PATENT DOCUMENTS

| | | |
|---|---|---|
| 3,745,969 A | 7/1973 | Huffman et al. |
| 4,155,784 A | 5/1979 | Mills et al. |
| 4,748,135 A | 5/1988 | Frijlink |
| 5,006,908 A | 4/1991 | Matsuoka et al. |
| 5,015,330 A | 5/1991 | Okumura et al. |
| 5,108,540 A | 4/1992 | Frijlink |
| 5,110,407 A | 5/1992 | Ono et al. |
| 5,370,738 A | 12/1994 | Watanabe et al. |
| 5,433,169 A | 7/1995 | Nakamura |
| 5,684,309 A | 11/1997 | McIntosh et al. |
| 6,233,265 B1 | 5/2001 | Bour et al. |
| 6,667,185 B2 | 12/2003 | Ishibashi et al. |
| 2002/0121642 A1 | 9/2002 | Doverspike et al. |
| 2002/0195606 A1 | 12/2002 | Edmond et al. |
| 2003/0006418 A1 | 1/2003 | Emerson et al. |
| 2003/0143765 A1 | 7/2003 | Ishibashi et al. |
| 2003/0157776 A1 | 8/2003 | Smith |
| 2004/0062282 A1 | 4/2004 | Matsuoka et al. |
| 2004/0211365 A1 | 10/2004 | Yamaguchi |
| 2005/0173728 A1 | 8/2005 | Saxler |
| 2006/0128122 A1 | 6/2006 | Bousquet et al. |
| 2008/0057197 A1 | 3/2008 | Liu |
| 2008/0142779 A1 | 6/2008 | Yang |
| 2008/0276860 A1 * | 11/2008 | Burrows ............... C23C 16/303 117/102 |
| 2008/0299703 A1 | 12/2008 | Oladeji |
| 2009/0056631 A1 | 3/2009 | Lai |

FOREIGN PATENT DOCUMENTS

| | | |
|---|---|---|
| JP | 08-56015 A | 2/1996 |
| JP | 11-074566 | 3/1999 |
| JP | 2000-164513 | 6/2000 |
| JP | 2001-119106 A | 4/2001 |
| JP | 2005-228757 A | 8/2005 |

OTHER PUBLICATIONS

"Indium-nitride growth by HPCVD: Real-time and ex-situ characterization," N. Dietz, book chapter 6 in "III-Nitrides Semiconductor Materials," ed. Z.C. Feng, Imperial College Press (ICP), ISBN 1-86094-636-4, pp. 203-235 (2006).

PCT International Search Report and Written Opinion for PCT/US2010/045329 dated Oct. 5, 2010.

PCT International Preliminary Report on Patentability for PCT/US2010/045329 dated Feb. 14, 2012.

Woods, et al., InN Growth by High Pressures Chemical Deposition: Real Time Optical Growth Characterization, Department of Physics and Astronomy, Georgia State University, Atlanta, Georgia, 2006. [Retrieved on Sep. 25, 2010]. Retrieved from the Internet: URL: www.phy-astr.gsu.edu/dietz/data/NALD_pub098_pre.pdf, pp. 1-27.

JP Patent Application 2012-524873, Decision of Rejection, dated Jan. 27, 2015.

JP Patent Application 2012-524873, Notice of Reasons for Rejection, dated Apr. 22, 2014.

European Extended Search Report, EP Patent Application 10808760. 2, dated Jul. 29, 2013.

Bhatta, R.P., et al., "Surface structure, composition, and polarity of indium nitride grown by high-pressure chemical vapor deposition", Applied Physics Letters 88 (2006).

JP Patent Application 2015-105648, Notice of Reasons for Rejection, dated Feb. 5, 2016.

* cited by examiner

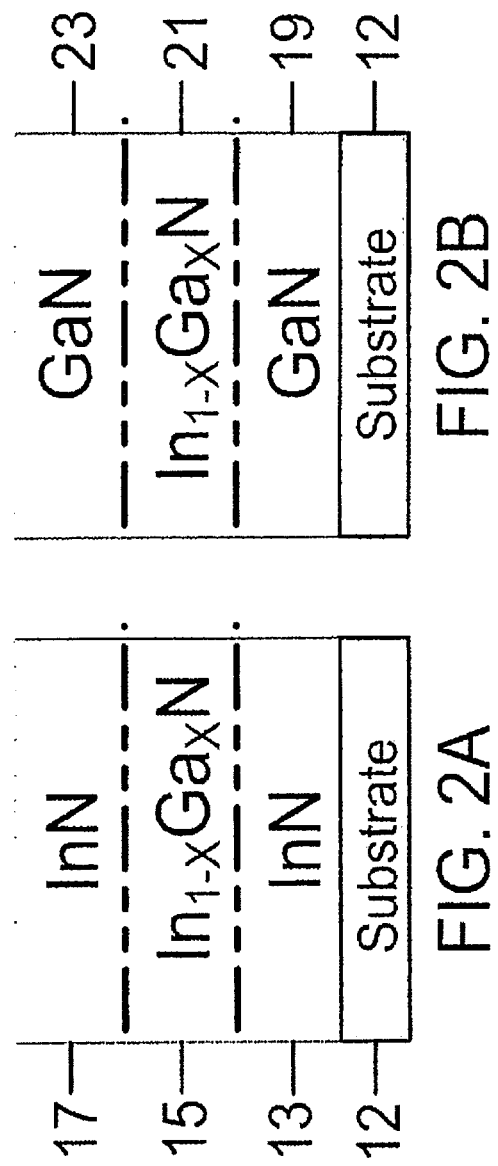

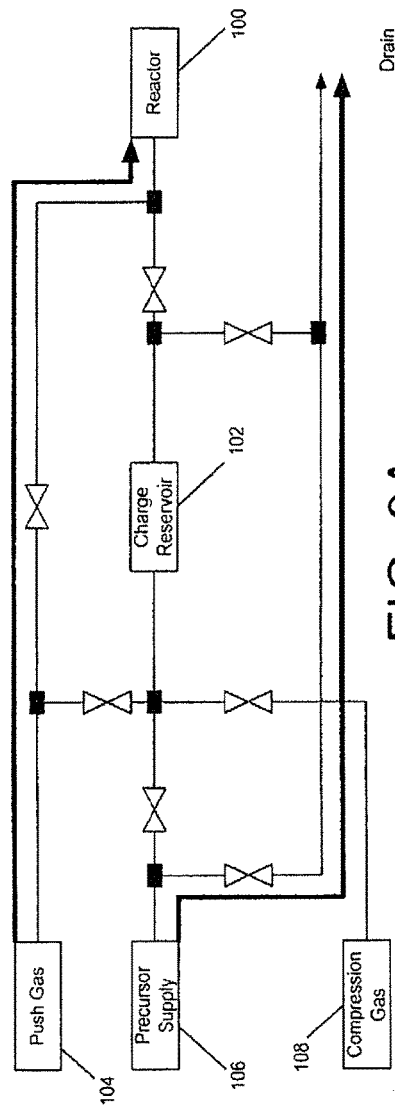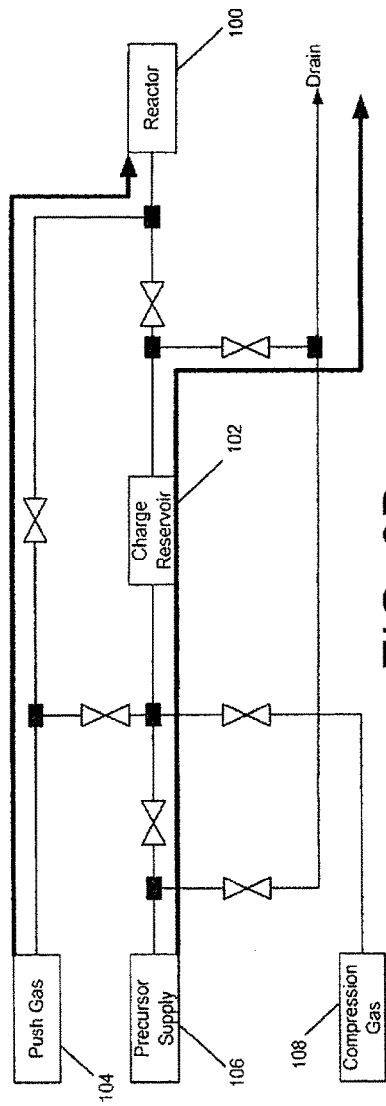

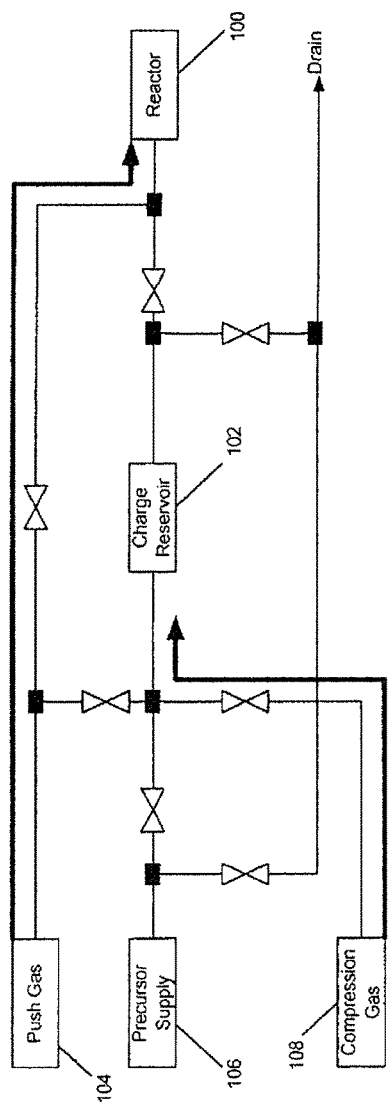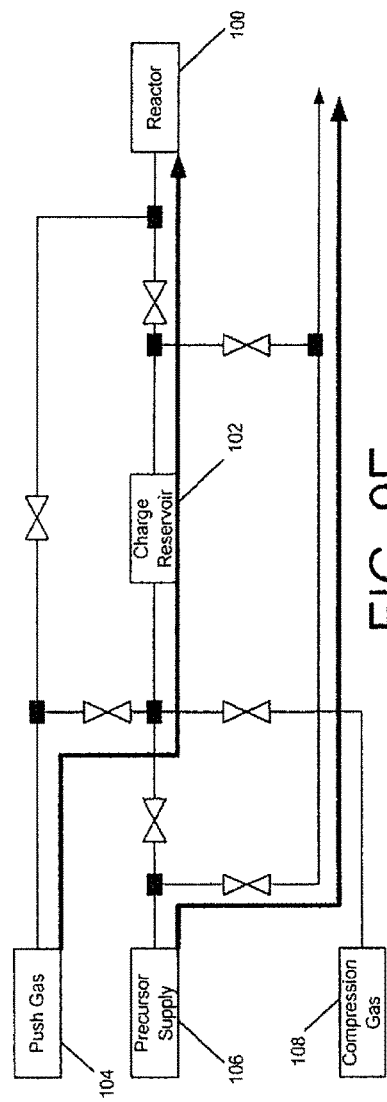

HIGH PRESSURE CHEMICAL VAPOR DEPOSITION APPARATUSES, METHODS, AND COMPOSITIONS PRODUCED THEREWITH

CROSS-REFERENCE TO RELATED APPLICATIONS

This application is a continuation of U.S. patent application Ser. No. 13/390,055, filed Feb. 10, 2012, now U.S. Pat. No. 9,243,329, which is the National Stage of International Patent Application No. PCT/US2010/045329, filed Aug. 12, 2010, which claims the benefit of U.S. Provisional Application No. 61/233,238, filed Aug. 12, 2009, all of which are incorporated by reference herein.

FEDERALLY SPONSORED RESEARCH OR DEVELOPMENT

This invention was made with U.S. government support under AFOSR Award # FA9550-07-1-0345. The U.S. government may have certain rights in this invention.

FIELD OF INVENTION

The disclosure is related to methods and systems for performing super-atmospheric pressure chemical vapor deposition and compositions obtained thereby.

BACKGROUND OF THE INVENTION

The possibility of developing optoelectronic emitter and detector device structures in a wide spectral range—from the infrared (IR) to ultraviolet (UV)—as well as high-frequency transistors operating at high powers and temperatures, has generated significant interest in group III-nitride compounds (e.g., indium nitride, gallium nitride, and aluminum nitride). These materials are mainly produced as epitaxially deposited films by metalorganic vapor phase epitaxy (MOVPE), which is sometimes referred to as metalorganic chemical vapor deposition (MOCVD or OMCVD), and molecular beam epitaxy (MBE). When halide compounds are utilized the process may also be referred to as halide vapor transport epitaxy (HVTE) or halide vapor phase epitaxy (HVPE). In MOCVD, a reactive gas flow is transported through a reaction zone (also denoted as a deposition zone), undergoes gas-phase decomposition reactions, reactive products diffuse towards the substrate surface, and surface reactions occur in the deposition zone on the substrate. The reactive precursor fragments become physi-sorbed and/or chemi-sorbed at the growth surface, diffuse, and nucleate at reaction sites, resulting in film growth.

However, indium-rich group III-nitrides and many other compounds, including oxygen-containing alloys, are highly susceptible to thermal decomposition at their optimum kinetic growth temperatures. Indium nitride (InN) is one of the most difficult group III-nitride semiconductor alloys to synthesize, since the equilibrium vapor pressure of nitrogen over InN is much higher compared to nitrogen over aluminum nitride (AlN) and nitrogen over gallium nitride (GaN), which makes it difficult to integrate InN into GaN- or AlN-based device structures. FIG. 1 shows the thermal decomposition pressures for the binary compounds AlN, GaN, and InN as a function of temperature.

The integration of higher concentrations of indium into group III-nitride alloys such as $In_{1-x}Ga_xN$ is a major challenge using low-pressure deposition techniques such as MBE and MOCVD due to thermodynamic stabilization limitations. Off-equilibrium approaches such as plasma-assisted MBE have been applied to transiently stabilize indium-rich group III-nitride alloys, but these techniques have not solved the fundamental problem of making thermodynamically stable products. For instance, in order to integrate indium-rich $In_{1-x}Ga_xN$ layers into a wide band gap group III-nitride heterostructure, indium-rich $In_{1-x}Ga_xN$ layers have to be stabilized at typical MOCVD conditions using temperatures between 800° C. and 1100° C. However, in common low-pressure processes, InN growth temperatures at or below 650° C. are required in order to stabilize the alloy. As the indium-content in $In_{1-x}Ga_xN$ increases, the growth temperature has to be increased and the group III-V precursor ratio adjusted. Thus, the required adjustment of the growth temperature for various indium fractions limits the quality of the $In_{1-x}Ga_xN$ layers and/or their integration within the same device structure. Presently, only materials with small amounts of indium ($x \geq 0.75$) have been made with considerable quality, while at higher indium mole fractions there seems to be a miscibility gap. F. K. Yam and Z. Hassan, *InGaN: An overview of the growth kinetics, physical properties and emission mechanisms*, Superlattices and Microstructures 43(1), pp. 1-23 (2008). Accordingly, there is a need for new systems and methods for providing thermodynamically stable alloys incorporating heterolayers with different partial pressures and thermal stabilities such that useful semiconductor materials may be obtained.

SUMMARY OF INVENTION

In one aspect, a thermodynamically stable semiconductor heterostructure is provided, that includes a first epitaxial layer comprising a first group III-nitride alloy and a second epitaxial layer comprising a second group III-nitride alloy on and contacting the first layer. The first group III-nitride alloy is an alloy that decomposes at ambient atmospheric pressure at a minimal temperature at which the second group III-nitride alloy deposits at ambient atmospheric pressure. The first group III-nitride alloy is an alloy that will not decompose at a super-atmospheric pressure and a temperature at which the second group III-nitride alloy deposits.

In another aspect, a reactor apparatus is provided. The reactor apparatus includes an enclosure capable of confining pressures of up to about 100 bar. The reactor apparatus further includes a substrate carrier adapted to hold a substrate in a reaction zone within the flow channel growth reactor, a growth surface on the substrate for growing epitaxial layers, a flow channel adapted to direct flow of a first set of reactive fluids along a first direction of flow over the growth surface, and an injector adjacent to the reaction zone adapted to inject a second set of reactive fluids into the reaction zone such that the second set of reactive fluids reacts with the first set of reactive fluids or decomposes to deposit a film of reacted product on the growth surface.

In another aspect, a method is provided comprising providing a growth surface in a reaction zone, supplying a first set of reactive fluids into the reaction zone across the growth surface in a first direction of flow substantially parallel to the growth surface, supplying a second set of reactive fluids into the reaction zone in a second direction of flow onto the growth surface, the second direction of flow being angularly offset to the first direction of flow, and reacting or decomposing the first set of reactive fluids and the second set of reactive fluids in the reaction zone to produce epitaxial layers on the growth surface.

In another aspect, a control system is provided and comprises a carrier gas source adapted to supply a carrier gas to a super-atmospheric pressure reactor, a plurality of reactive fluid sources adapted to supply a plurality of reactive fluids to the super-atmospheric pressure reactor including a first reactive fluid source adapted to supply a first set of reactive fluids to the super-atmospheric pressure reactor and a second reactive fluid source adapted to supply a second set of reactive fluids to the super-atmospheric pressure reactor, a plurality of actuators including a first actuator for starting, stopping, or modulating the flow of the first set of reactive fluids to the super-atmospheric pressure reactor and a second actuator for starting, stopping, or modulating the flow of the second set of reactive fluids to the super-atmospheric pressure reactor, a reaction zone comprising a growth surface within the super-atmospheric pressure reactor, and a controller configured to control the plurality of actuators to embed the first set of reactive fluids and the second set of reactive fluids into the carrier gas, while maintaining a substantially constant pressure in the reaction zone and total volumetric flow rate through the reaction zone.

BRIEF DESCRIPTION OF THE DRAWINGS

FIGS. 2A-B are diagrams illustrating exemplary heterostructures grown on a substrate material, in accordance with one or more embodiments of the present invention.

FIGS. 9A-E are schematics, illustrating methods and control systems for embedding pulses of reactive fluids in a carrier gas and composition control on an atomic level according to one or more embodiments of the present invention.

DETAILED DESCRIPTION OF THE INVENTION

Figure 1:
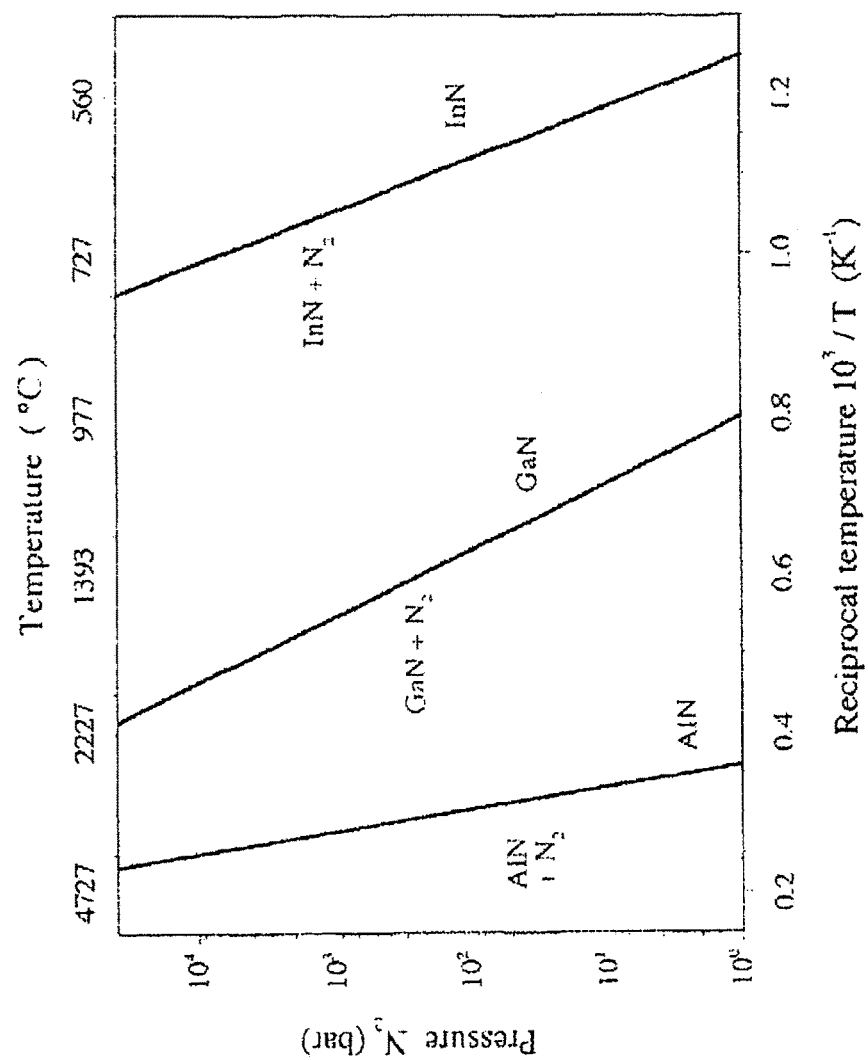
FIG. 1 is a graph illustrating thermal decomposition pressures for common group III-nitride compound semiconductors.

It has been discovered that growth techniques that use elevated pressures offer a pathway to overcome existing limitations in the epitaxial growth of high quality group III-nitride alloy layers. Furthermore, it has been discovered that growing indium-rich group III-nitride epitaxial layers at high-pressure domains (i.e. greater than atmospheric pressure, or at "super-atmospheric pressure") offers several advantages. Group III-nitride alloy epitaxial layers can be grown at higher growth temperatures without experiencing thermal decomposition. For example, InN can be grown under a blanket of molecular nitrogen at approximately 15 atm at 750° C.-850° C. (compared to below 600° C. for low-pressure MOCVD). Analysis of epitaxial layers produced under such conditions indicates improved nucleation kinetics, improved surface morphology, and improved microstructure at the elevated growth temperatures.

Also, under such conditions, $In_{1-x}Ga_xN$, $In_{1-x}Al_xN$, and/or $In_{1-x-y}Al_xGa_yN$ may be grown on AlN, GaN, and/or InN binary layers to produce useful high-quality, heterostructure semiconductors. Additional layers of $In_{1-x}Ga_xN$, $In_{1-x}Al_xN$, $In_{1-x-y}Al_xGa_yN$, AlN, GaN, and/or InN may be further grown on the so-formed heterostructure semiconductors. In particular, operating at higher temperatures and higher pressures allows for better matching of $In_{1-x}Ga_xN$, $In_{1-x}Al_xN$, and/or $In_{1-x-y}Al_xGa_yN$ growth temperature with optimum AlN, GaN, and/or InN processing temperatures.

Heterostructures

The formation of $In_{1-x}Ga_xN$ ternary alloys in the whole composition range is of great interest, since it would allow for the tuning of the direct band gap from the near infrared (e.g., InN around 0.7 eV) to the near UV wavelength regions (e.g., GaN at 3.5 eV). However, experimental and theoretical predictions indicate that the $In_{1-x}Ga_xN$ ternary alloys might be thermodynamically and/or kinetically unstable with a tendency toward clustering and phase separations. Specifically, it has been proposed that the large differences in the tetrahedral radii between InN and GaN may induce strain that can either lead to formation of particular sublattices (phase separations) or an atomic ordering within the sublattice, resulting in a deviation from homogeneity (nano-clustering). Ayan Kar, Dimitri Alexson, Mitra Dutta, and Michael. A. Stroscio, *Evidence of compositional inhomogeneity in $In_xGa_{1-x}N$ alloys using ultraviolet and visible Raman spectroscopy*, J. Appl. Phys. 104, 073502 (2008); and I. H. Ho, G. B. Stringfellow, *Incomplete solubility in nitride alloys*, Materials Research Society Symposium Proceedings 449, p. 871 (1997).

In one aspect, a thermodynamically stable semiconductor heterostructure composition is provided. As used herein, the term "heterostructure" refers to layers of semiconductor materials comprised of two or more epitaxial layers of semiconductor materials comprising different compositions from each other. As used herein, the term "thermodynamically stable heterostructure" refers to semiconductor heterostructure compositions that are, once prepared at elevated temperatures and at super-atmospheric pressures, both thermodynamically and kinetically stable at ambient pressure and at ambient temperature. Epitaxial layers of group III-nitride alloys are considered "semiconductor heterostructure compositions" when such materials have an effective structural quality to be suitable for use in semiconductor materials. As used herein, "structural quality" refers to the crystalline perfection of the epitaxial layers, as measured by the full width at half maximum ("FWHM") peak width in an X-ray diffraction graph for the group III-nitride compositions. For light-emitting diodes ("LEDs"), good structural quality is represented by an FWHM of less than about 200 arcseconds. For laser diodes ("LDs"), good structural quality is represented by an FWHM of less than about 50 arcseconds.

As used herein, the terms "epitaxial layer" and "epitaxial film" are equivalent and refer to a single crystal ("monocrystalline") epitaxy layer of deposited material that is grown on a suitable substrate. Epitaxial layers may be grown from gaseous or liquid precursors. Because the substrate acts as a seed crystal, the deposited epitaxial film takes on a lattice structure and orientation identical to those of the substrate. This film growth process is different from other thin-film deposition methods which deposit polycrystalline or amorphous films, even on single-crystal substrates.

The thermodynamically stable semiconductor heterostructure composition comprises a first epitaxial layer consisting of a first group III-nitride alloy. As used herein, the term "group III-nitride alloy" refers to any one of $In_{1-x}Ga_xN$, $In_{1-x}Al_xN$, $In_{1-x-y}Al_xGa_yN$, AlN, GaN, or InN. The composition further comprises a second epitaxial layer on and contacting said first layer, consisting of a second group III-nitride alloy. As used herein, the term "on and contacting" refers to a first layer covered or embedded by a second layer and both layers contacting one another. The first group III-nitride alloy is an alloy that decomposes at ambient atmospheric pressure at a minimal temperature at which the second group III-nitride alloy deposits at ambient atmospheric pressure. Additionally, the first group III-nitride alloy is both kinetically and thermodynamically stable (i.e., will not decompose) at super-atmospheric pressure and at the temperature at which the second group III-nitride alloy deposits.

In one embodiment, the composition comprises a first group III-nitride alloy that is AlN, GaN, or InN. In another embodiment, the composition comprises a second group III-nitride alloy that is AlN, GaN, or InN. In still other embodiments, the composition comprises a first epitaxial layer that is AlN, GaN, or InN and a second epitaxial layer that is AlN, GaN, or InN.

One embodiment of a composition according to this invention comprises a first group III-nitride alloy that is $In_{1-x}Ga_xN$, $In_{1-x}Al_xN$, or $In_{1-x-y}Al_xGa_yN$ and is further defined by the variables x and y. In one aspect, the variables x and y are less than about 0.65, less than about 0.50, less than about 0.35, less than about 0.25, less than about 0.15, or less than about 0.10.

Another embodiment of a composition according to this invention comprises a second group III-nitride alloy that is $In_{1-x}Ga_xN$, $In_{1-x}Al_xN$, or $In_{1-x-y}Al_xGa_yN$ and is further defined by the variables x and y. In one aspect, the variables x and y are less than about 0.65, less than about 0.50, less than about 0.35, less than about 0.25, less than about 0.15, or less than about 0.10.

In one embodiment, the composition comprises a first group III-nitride alloy that is $In_{1-x}Ga_xN$, $In_{1-x}Al_xN$, or $In_{1-x-y}Al_xGa_yN$ and a second group III-nitride alloy that is $In_{1-x}Ga_xN$, $In_{1-x}Al_xN$, or $In_{1-x-y}Al_xGa_yN$. In another embodiment, the composition comprises a first group III-nitride alloy that is AlN, GaN, or InN and a second group III-nitride alloy that is $In_{1-x}Ga_xN$, $In_{1-x}Al_xN$, or $In_{1-x-y}Al_xGa_yN$. In still another embodiment, the composition comprises a first group III-nitride alloy that is $In_{1-x}Ga_xN$, $In_{1-x}Al_xN$, or $In_{1-x-y}Al_xGa_yN$ and a second group III-nitride alloy that is AlN, GaN, or InN.

FIG. 2A illustrates an exemplary embodiment of a heterostructure composition. A first epitaxial layer 13 may be deposited onto a substrate material 12. The substrate material 12 may be any suitable nucleation template material including but not limited to sapphire, silicon carbide, zinc oxide, or silicon. In some embodiments, the first epitaxial layer 13 may be a group III-nitride alloy selected from the group consisting of AlN, GaN, and InN. FIG. 2A further shows a second epitaxial layer 15 deposited onto and in contact with the first epitaxial layer 13, wherein the second epitaxial layer 15 is a group III-nitride alloy selected from the group consisting of $In_{1-x}Ga_xN$, $In_{1-x}Al_xN$, and $In_{1-x-y}Al_xGa_yN$. As seen in FIG. 2A, an additional epitaxial layer 17 may further be deposited onto and in contact with the second epitaxial layer 15. The additional epitaxial layer 17 may be a group III-nitride alloy selected from the group consisting of AlN, GaN, and InN (as shown) or may be a group III-nitride alloy selected from the group consisting of $In_{1-x}Ga_xN$, $In_{1-x}Al_xN$, and $In_{1-x-y}Al_xGa_yN$ (not shown).

Another exemplary embodiment of a heterostructure composition is illustrated in FIG. 2B. A first epitaxial layer 19 may be deposited onto a substrate material 12. The substrate material 12 may be any suitable nucleation template material including but not limited to sapphire, silicon carbide, zinc oxide, or silicon. In some embodiments, the first epitaxial layer 19 may be a group III-nitride alloy selected from the group consisting of AlN, GaN, and InN. FIG. 2B further shows a second epitaxial layer 21 deposited onto and in contact with the first epitaxial layer 19, wherein the second epitaxial layer 19 is a group III-nitride alloy selected from the group consisting of $In_{1-x}Ga_xN$, $In_{1-x}Al_xN$, and $In_{1-x-y}Al_xGa_yN$. As seen in FIG. 2B, an additional epitaxial layer 23 may further be deposited onto and in contact with the second epitaxial layer 21. The additional epitaxial layer 23 may be a group III-nitride alloy selected from the group consisting of AlN, GaN, and InN (as shown) or may be a group III-nitride alloy selected from the group consisting of $In_{1-x}Ga_xN$, $In_{1-x}Al_xN$, and $In_{1-x-y}Al_xGa_yN$ (not shown).

Reactor Designs

In one aspect, a reactor apparatus is provided for growing epitaxial layers of group III-nitride alloys that have an effective structural quality to be suitable for use in semiconductor materials. The design of the reactors for epitaxial film growth at super-atmospheric pressures considers fluid dynamics, chemistry, kinetics, and mass transport principles. Even more specifically, the design accounts for gas and surface reaction chemistries of the reactants under the epitaxial film growth conditions.

The reactor apparatus for growing epitaxial layers on a substrate having a growth surface may include a substrate carrier adapted to hold a substrate in a reaction zone within the reactor, and a flow channel adapted to direct flow of a first set of reactive fluids along a first direction of flow over the growth surface of the substrate when the substrate is mounted to the substrate carrier. An injector may be provided adjacent to the reaction zone and be adapted to inject a second set of reactive fluids into the reaction zone such that the second set of reactive fluids reacts with the first set of reactive fluids or decomposes to deposit a film of reacted product on the growth surface. The reactor apparatus may further comprise an enclosure capable of confining pressures of up to about 100 bar.

The term "set" as used herein to reference reactive fluids generally refers to a reactive fluid having one or more constituent parts. Accordingly, a "set of fluids" may comprise a volume of a reactive fluid consisting only of a carrier gas or a single reactive fluid. It may also comprise a fluid having multiple constituents or reactive fluids.

In some embodiments, the substrate carrier is adapted to hold the substrate in a first plane parallel to the first direction of flow. As used herein, the terms "parallel" and "substantially parallel" refer to fluid flow directions in which the vector of flow carries the reactive fluid across the plane of a substantially planar substrate from an upstream edge of the substrate toward a downstream edge of the substrate.

In some embodiments, the vector of flow may have an angle of incidence with respect to the plane of the substrate; however, the angle of incidence with respect to the growth surface may be greater than about 45 degrees, greater than about 60 degrees, greater than about 75 degrees, or greater than about 90 degrees. An angle of incidence of about 90 degrees is considered parallel.

In some embodiments, the injector for injecting the second set of reactive fluids into the reaction zone is adapted to distribute the second set of reactive fluids evenly across the growth surface of the substrate. In some embodiments, the injector may comprise a porous ceramic material. Alternatively, the injector may comprise a distribution block having a plurality of conduits passing therethrough. In another embodiment, the injector is adapted to direct reactive fluids to either the reaction zone or to the growth surface.

Moreover, in some embodiments, the injector may be configured to inject the second reactive fluid into the reactor in a direction substantially perpendicular to the first direction of flow. The terms "perpendicular" and "substantially perpendicular" as used herein refer to fluid flow directions in which the vector of flow creates a significant angle of incidence relative to the substrate or the direction of flow of the first reactive fluid.

In some embodiments, the vector of flow directs the reactive fluid into the surface plane (i.e., the plane upon which a film is deposited) of a substantially planar substrate. The angle of incidence with respect to plane of the substrate may be less than about 45 degrees, less than about 30 degrees, less than about 15 degrees, or less than about 0 degrees. An angle of incidence of about 0 degrees is considered perpendicular.

In some embodiments, the flow channel may be fluidly connected to a group V precursor feed source and the injector may be fluidly connected to a group III precursor feed source. Alternatively, the flow channel may be fluidly connected to the group III precursor feed source and the injector may be fluidly connected to the group V precursor feed source. As used herein, the term "precursor feed source" means a source of reactive fluids. For example, a precursor feed source may include but are not limited to organometallic precursors such as trimethylindium, trimethylgallium, liquid precursors such as hydrazine and/or gaseous precursors such as ammonia or silane.

In some embodiments, a controller is provided to control the flow of the first set of reactive fluids and the second set of reactive fluids such that the first set of reactive fluids and the second set of reactive fluids are transported to the reaction zone as temporally and spatially controlled as pulses or modulated flows. The term "pulse" as used herein generally refers to a volume of a reactive fluid having a flux that is controlled temporally and/or spatially such that the pulse has a discrete beginning and end relative to the continuous carrier gas flow the pulse is embedded within. Thus, in one embodiment, the controller may be adapted to embed a reactive fluid as a pulse into a continuous feed of carrier gas for transport to the reaction zone, the pulse having a temporally and spatially concentrated distribution of the reactive fluid within the continuous feed.

Figure 3A:
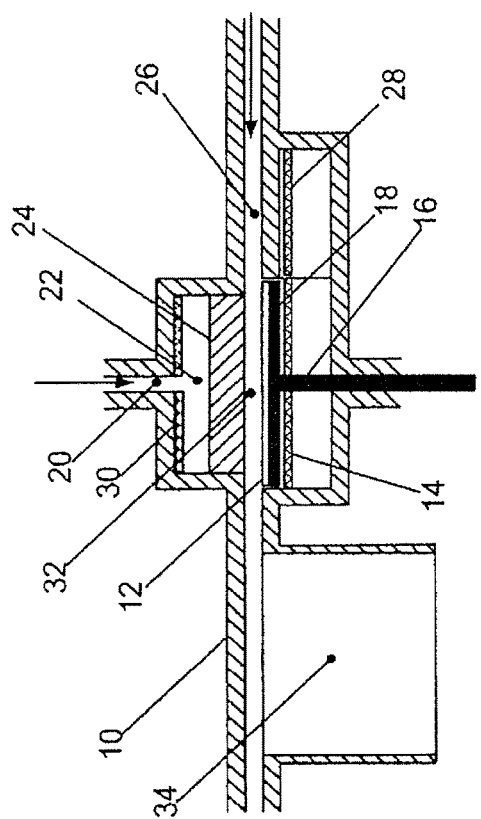
FIG. 3A is a section view, illustrating an exemplary super-atmospheric pressure reactor according to one or more embodiments of the present invention.
Figure 3B:
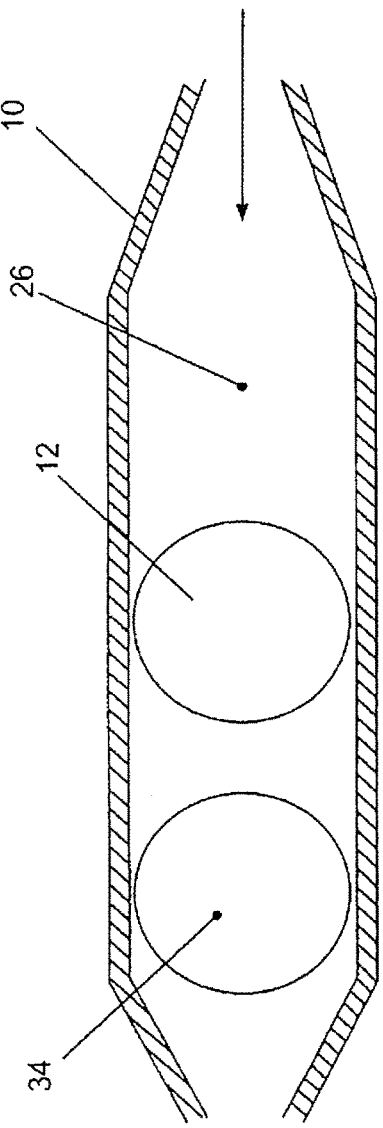
FIG. 3B is a section view, illustrating an exemplary super-atmospheric pressure reactor according to one or more embodiments of the present invention.

One embodiment of a super-atmospheric pressure reactor is illustrated in FIG. 3A and FIG. 3B. A growth reactor 10 may be embedded in an outer pressure vessel (not shown).

The growth reactor 10 includes a flow channel 26 that transports a reactive fluid in the direction of a substrate 12. The substrate 12 may be any substrate suitable for the growth of an epitaxial layer of a group III-nitride alloy, such as for example sapphire, silicon carbide, silicon, or zinc oxide. In some instances, a first epitaxial layer comprising a group III-nitride alloy is deposited and thus serves as the substrate for growth of a second epitaxial layer. In other embodiments, additional epitaxial layers comprising a group III-nitride alloy may serve as the substrate for growth of a subsequent epitaxial layer. The substrate 12 is mounted to a substrate carrier 18, which holds the substrate 12 such that the growth surface of the substrate lies in a plane substantially parallel to the direction of flow of the flow channel 26. The substrate may have a small tilt angle with respect to the flow channel in order to provide effective gas flow kinetics and surface nutrient supply for optimized growth surface chemistry.

A shaft 16 might be attached to the substrate carrier 18 and might be mechanically linked to a motor such that the substrate carrier 18 and the substrate 12 rotate angularly in the plane of the growth surface. In some embodiments of the present invention, the shaft 16 rotates the substrate 12 and the substrate carrier 18 at low rotation speeds, preferably between 1 and 20 Hz. In other embodiments, higher rotation speeds may be used so that improved growth rate, surface chemistry, and/or film uniformity requirements may be satisfied if and when such requirements arise. Thus, in one embodiment the growth reactor 10 may further comprise a device adapted to rotate the substrate carrier.

A reaction zone 32 is provided above the substrate 12 for growing an epitaxial layer. A showerhead injector 24 may be located above the reaction zone 32 opposite the substrate 12. The showerhead injector 24 may be adapted to inject a second set of reactive fluids onto the surface of the substrate in a direction perpendicular to flow channel 26. The showerhead injector 24 may be generally adapted to distribute the second set of reactive fluids evenly across the growth surface. In some embodiments, the showerhead injector 24 may comprise a porous glass, ceramic, or metal material. In other embodiments, the showerhead injector 24 may comprise a distribution block having a plurality of conduits passing from the chamber 22 to the reaction zone 32. A conduit 20 may be provided for supplying the second set reactive fluids to the chamber 22.

In certain embodiments, the reactive fluid that is transported through the flow channel 26 may be a group V precursor including but not limited to ammonia [$NH_3$], dimethylhydrazine [$(CH_3)_2N(NH_2)$], or t-butylamine [$(CH_3)_3CNH_2$]. The second set of reactive fluids may comprise a group III reactive precursor, including but not limited to metalorganic precursors such as trimethylindium [$In(CH_3)_3$] ("TMI"), trimethylaluminum [$Al(CH_3)_3$] ("TMA"), or trimethylgallium [$Ga(CH_3)_3$] ("TMG"). The reactive fluid(s) may be transported to the reaction zone or the substrate either embedded in a carrier gas stream or injected in liquid form.

The temperature of the reaction zone 32 as well as the temperature of the substrate 12 may be controlled by applying heat inductively or conductively via a heating element 14 to the substrate carrier 18. The pressure in the reaction zone 32 may be controlled by adjustment of the pressure of the carrier gas and the inert gas between the growth reactor 10 and the outer pressure vessel. A differential pressure control may be employed between the growth reactor 10 and outer pressure vessel for stable operation. Although the growth reactor 10 may be capable of operating at atmospheric and sub-atmospheric pressures, the growth reactor 10 may be preferably operated at super-atmospheric pressures, including the reactor pressure domain of 2 to 100 bar. In still another embodiment, the growth reactor 10 may be operated in the reaction pressure domain of 2 to 30 bar.

A second heating element 28 may be provided upstream of the substrate 12 to allow for the pre-heating the first set of reactive fluids. This heating element may provide independent control of the decomposition kinetics of the first set of reactive fluids.

Similarly, a third heating element 30 may be provided for pre-heating the second set of reactive fluids, which enables the control of the decomposition kinetics of the second set of reactive fluids. The heating element 30 may be isolated from the reaction zone 32 in order to avoid reactions with the reactive fluid injected through the flow channel 26 and may allow independent control of the decomposition kinetics of each set of reactive fluids.

As illustrated in FIGS. 3A and 3B a "load lock" system may be provided for loading and/or unloading the substrate 12 into or out of the growth reactor 10 without exposing the growth reactor 10 to the ambient atmosphere. The system may utilize an isolation chamber 34 for inserting or removing the substrate 12 from the growth reactor 10.

Figure 5:
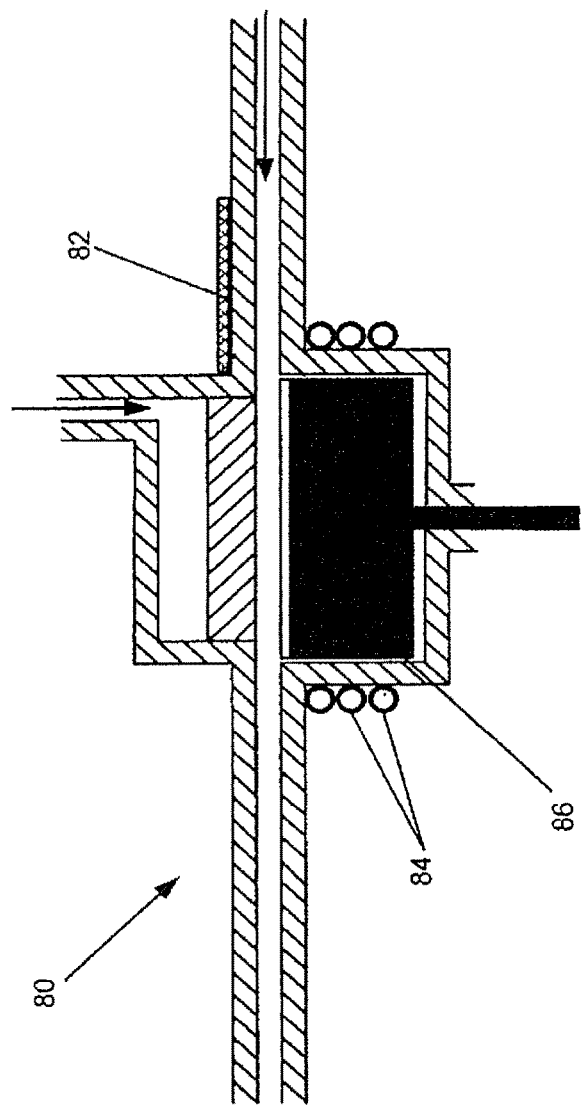
FIG. 5 is a section view, illustrating an exemplary super-atmospheric pressure reactor, which is embedded in an outer pressure-confining vessel, according to one or more embodiments of the present invention.

Another embodiment of a super-atmospheric pressure reactor 80 is illustrated in FIG. 5. In this embodiment, the substrate carrier 86 may be inductively heated via RF coupling by an RF coil 84 that encircles the substrate carrier 86. A second heater 82 may be located adjacent to the flow path of the reactive fluids and may heat the reactive fluids before they reach the reaction zone.

Growth Methods

In another aspect, a method of growing epitaxial layers and heterostructures on a substrate is provided. First, the growth surface of the substrate, which may be placed on a substrate carrier, faces the reaction zone. Thereafter, a first reactive fluid may be supplied into the reaction zone across and above the growth surface in a first direction of flow parallel to the growth surface and a second reactive fluid may be supplied into the reaction zone in a second direction of flow onto the growth surface, the second direction of flow being angularly offset from the first direction of flow. Without being limited by any structural chemistry theory, the first reactive fluid and the second reactive fluid may then be allowed to decompose into precursor fragments in the reaction zone, which then may diffuse to the growth surface and chemi-sorb and/or physi-sorb at the growth surface of the substrate. The term "angularly offset" is used herein to characterize directions of flow and refers to flow vectors, which may be at intersecting angles.

In some embodiments, the method further comprises maintaining a super-atmospheric pressure in the reaction zone. In some embodiments, the growth of epitaxial layers of group III-nitride alloys may be performed at a super-atmospheric pressure of between 2 and 100 bar in the reaction zone. In another embodiment, the growth of epitaxial layers of group III-nitride alloys may be performed at a super-atmospheric pressure of between 2 and 30 bar in the reaction zone. The pressure of the growth reactor may generally be maintained by supplying carrier gas into the reaction zone at the desired pressure and flow rate.

As will be discussed in greater detail subsequently, in some embodiments, the pressure of the reaction zone and total volumetric flow rate of carrier gas and reactive fluids may be controlled so as to remain constant during epitaxial film growth of a specific group III-nitride alloy. To accomplish this, reactive fluids may be embedded into the carrier gas such that the overall flow velocity in the reaction zone remains constant. The embedding and injection scheme may be precisely controlled to prevent variations in the total volumetric flow rate of the carrier gas and reactive fluids through the reaction zone. As such, the pulses of the reactive fluids displace a portion of the volume of the carrier gas substantially equal to the volume occupied by the pulse at the operating pressure. Each specific epitaxial layer of group III-nitride alloy to be grown may require a different pressure regime. The transition between different group III-nitride alloys grown within different pressure regimes may be accomplished by utilizing controlled pressure transition regimes, where the pressure is ramped up/down without introducing pressure fluctuations that may influence the quality of the growing epitaxial layers.

In some embodiments, the method further comprises rotating the growth surface in the reaction zone while supplying the first reactive fluid and the second reactive fluid into the reaction zone. The rotation may assist in providing an even distribution of the reactive fluids across the growth surface.

Moreover, in some embodiments, the method comprises injecting the first reactive fluid into the reactor at a first time and injecting the second reactive fluid into the reactor at a second time such that said first reactive fluid and the second reactive fluid are present in the reaction zone at substantially the same time. The term "substantially the same time" as used herein to describe the relative arrival time of the reactive fluids generally means that the first reactive fluid and the second reactive fluid are present in the reaction zone at the same time even if one of the reactive fluids arrives first or is present in the reaction zone for a longer duration than the other reactive fluid. In some embodiments, the method further comprises monitoring and controlling in real time the composition of gas phase constituents and/or reactive fluids in the reaction zone.

In some embodiments, the first set of reactive fluids and the second set of reactive fluids alternately comprise a group III reactive fluid and a group V reactive fluid.

Referring back to FIG. 3A, the method may include transporting a first set of reactive fluids to the reaction zone 32 across and above the growth surface of the substrate 12 in a direction of flow parallel to the growth surface. For example, the first set of reactive fluids may be transported to the reaction zone 32 via a flow channel 26 as illustrated in FIGS. 3A and 3B. A second set of reactive fluids may be injected into the reaction zone 32 in a second direction of flow onto the growth surface of the substrate 12. For example, the second set of reactive fluids may be injected into the reaction zone 32 through a close-coupled showerhead injector 24 as illustrated in FIG. 3A. The second direction of flow may be substantially perpendicular to the direction of flow of the first set of reactive fluids.

In some embodiments, the reactive fluids may be injected into the reaction zone 32 in timed pulses (i.e., the flux of the constituent gases are temporally controlled). The growth reactor 10 of FIGS. 3A and 3B may be particularly well-suited for such an injection method.

Figure 4:
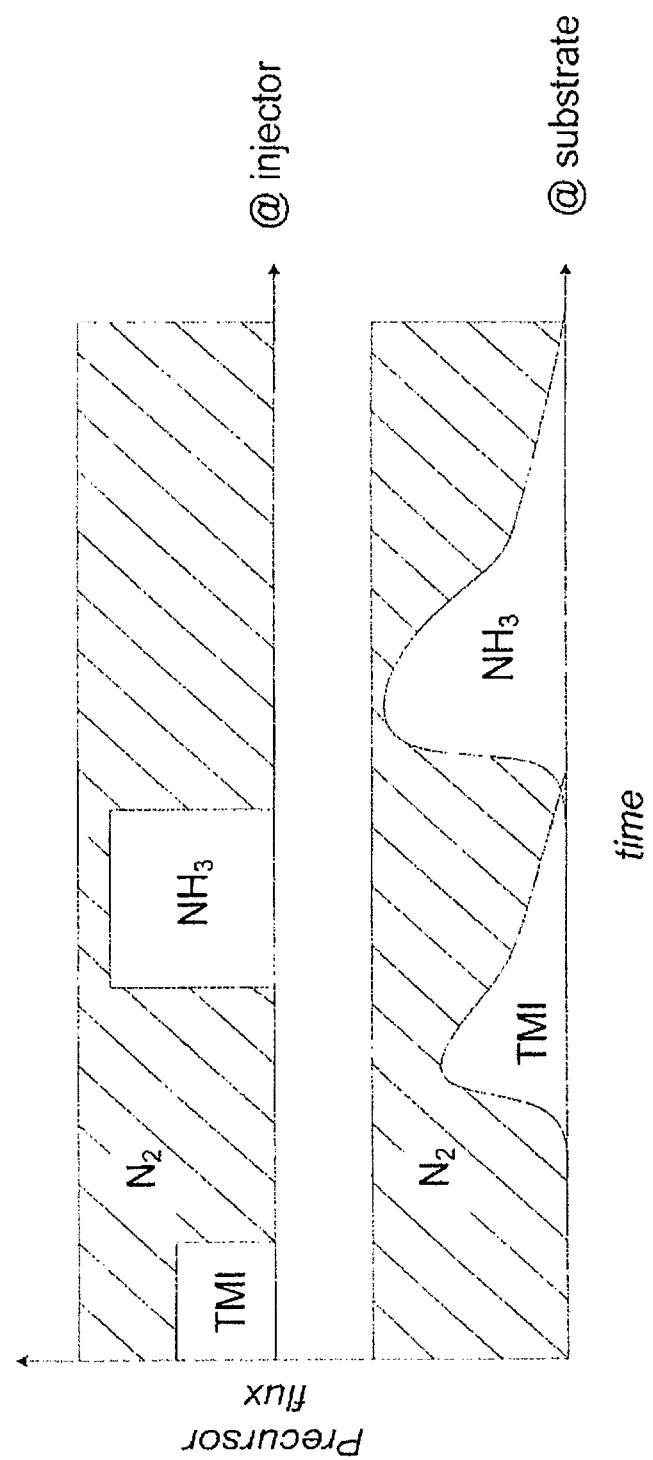
FIG. 4 is a graph, illustrating a pulse injection scheme according to one or more embodiments of the present invention.

FIG. 4 illustrates a pulse injection scheme in which the reactive fluids are injected into a common flow path. For illustration purposes, the reader may envisage each reactive fluid being injected through the flow channel 26 of the growth reactor 10 of FIG. 3 as alternating pulses. As shown in FIG. 4, a pulse of TMI may be injected into a carrier gas stream (e.g., $N_2$) followed by a pulse of ammonia. The total gas flow (carrier gas plus embedded reactive fluids) as well as the pressure in the reaction zone may be kept constant at all times in the present example.

After a set period of time, each reactive component reaches the reaction zone and the growth surface of the substrate 12. During the period of time the pulse is transported from the injector to the substrate 12, the pulses may have broadened due to reduced flow velocity at the boundaries of the flow channel 26. This may result in some overlap of the embedded reactive fluid pulses, as in the present example where both ammonia and TMI are present in the flow channel 26 and thus the occurrence of gas phase reactions involving the reactive fluids prior to the reactive fluids reaching the substrate 12 may occur.

By injecting the group III and group V reactive fluids into the reaction zone 32 via different paths, it should be appreciated that the growth reactor 10 of FIGS. 3A and 3B may be well-suited for precisely controlling the conditions under which the epilayers are produced. For example, the separation of the injection paths of the reactive fluids (e.g., group III and group V reactive fluids) may significantly reduce or entirely eliminate potential reactions of the reactive fluids in the flow channel 26 and may allow for the introduction of each reactive fluid at optimal timing and/or closer spacing of the pulses. This may allow for optimized reactive fluid material usage in each pulse and for faster growth rates to be achieved.

In some embodiments, the pressure of the reaction zone and the total volumetric flow rate of reactive fluids and carrier gas through the reactor may remain constant throughout the growing process of a specific compositional film/alloy arrangement. A control system may be provided to inject metered pulses of reactive fluids into the reactor while balancing the flow rate of carrier gas to maintain a substantially constant total volumetric flow rate through the reactor, a substantially constant average flow velocity, and/or a substantially constant pressure in the reaction zone. Accordingly, the reactive fluids may be injected into the carrier gas stream in metered pulses, in which each pulse may be metered in both duration and amplitude. The amplitude of the pulse corresponds to the average volumetric flow rate of the reactive fluid in the pulse, and the product of the duration and amplitude is equivalent to the total volume of reactive fluid for the pulse. Furthermore, each pulse may be separated from a subsequent pulse by a pre-designated interval in which only carrier gas is injected into the reactor. Each of these control parameters (duration, amplitude, and/or separation) may be automatically adjusted and controlled, depending on the predetermined process parameter of each layer alloy and its composition. Thus, one embodiment of a method performed by the present invention comprises monitoring and controlling in real time the compositional and spatial distribution of gaseous constituents in the reaction zone.

Control Systems

In another aspect, a control system may be provided for growing a semiconductor quality heterostructure using super-atmospheric pressure growing conditions. The control system may control the injection of a first and a second reactive fluid into a growth reactor having a reaction zone for growing a film on a substrate. The control system comprises a carrier gas source adapted to supply a carrier gas to the super-atmospheric pressure reactor and a plurality of reactive fluid sources adapted to supply a plurality of reactive fluids to the super-atmospheric pressure reactor including a first reactive fluid source adapted to supply the first reactive fluid to the super-atmospheric pressure reactor and a second reactive fluid source adapted to supply the second reactive fluid to the super-atmospheric pressure reactor. A plurality of actuators may also be provided, including a first actuator for the flow of the first set of reactive fluids to the super-atmospheric pressure reactor and a second actuator for starting and stopping the flow of the second set of reactive fluids to the super-atmospheric pressure reactor. A controller also may be provided and may be configured to control the plurality of actuators to embed the first set of reactive fluids and the second set of reactive fluids into the carrier gas while maintaining a substantially constant pressure in the reaction zone and total volumetric flow rate through the reaction zone.

In some embodiments, the control system may be configured to supply carrier gas through the reaction zone at a first constant volumetric flow rate in a non-reacting phase, the first constant volumetric flow rate being substantially equal to said total volumetric flow rate. During reaction phases, the volumetric flow rate of carrier gas passing through the reaction zone may be reduced to offset the volumetric flow rate of reactive fluids passing through the reaction zone. The control system may further be configured to maintain a constant pressure in the reaction zone of about 2 bar to about 100 bar, or from about 2 bar to about 30 bar. The terms "constant pressure" and "substantially constant pressure" as used herein may be used interchangeably and generally refer to methods and systems in which the pressure in the reaction zone does not significantly change or fluctuate when growing a film on a substrate. Accordingly, the pressure of the reaction zone is "substantially constant" if during non-reacting phases (i.e., when only carrier gas is supplied through the reaction zone), the pressure in the reaction zone is the same or less than about 0.01 bar different than during reacting phases (i.e., when reactive fluids are embedded in the carrier gas).

In some embodiments, the control system may be used to inject a group III and a group V reactive fluid into the reactor.

A control system for injecting pulses of reactive fluids into a carrier gas stream is illustrated in FIGS. 9A-9E. The control system includes a plurality of valves to control the flow of carrier gas (such as nitrogen) and reactive fluid through a fluid circuit to a reactor 100. Alternatively, a more sophisticated mechanical injection system such as a rotational cylinder injector or other type of manifold that mimics a plurality of valves may be used as an equivalent. The carrier gas may be supplied to the circuit from a push gas supply 104 and a compression gas supply 108. The push gas supply 104 may provide carrier gas to the circuit at a sufficient flow rate to meet the pre-designated flow rate for the reactor 100. The compression gas supply 108 may provide carrier gas to the circuit as required to maintain the needed pressure in the reaction zone and/or to pressurize parts of the fluid circuit as needed. It should be noted that the control system illustrated in FIGS. 9A-9E is intended only to illustrate one possible control system for embedding a pulse of a reactive gas in a carrier gas. Various other fluid circuit configurations may be used to embed reactive fluids in carrier gas streams to perform the methods described herein.

FIG. 9A illustrates a possible valve control arrangement that may control the flow paths of carrier gas and reactive fluid when the plurality of valves are opened or closed in default positions. In this configuration, a constant flow rate of carrier gas may be supplied to the reactor 100 while the reactive fluid may be routed to a drain.

To prepare a reactive fluid "pulse," the valves may be opened and closed as illustrated by the flow paths of FIG.

Figure 9C:
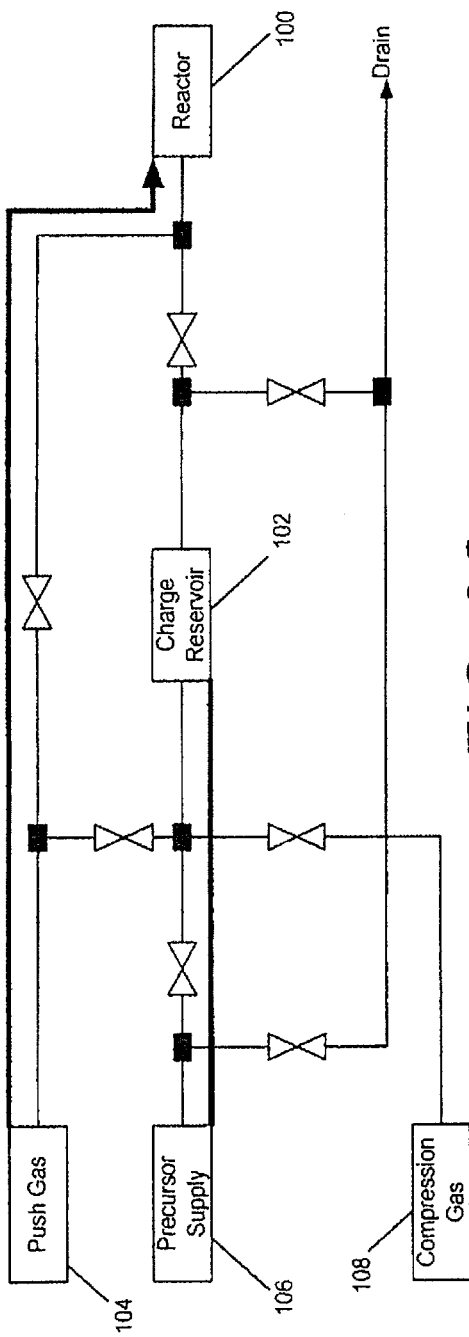

9B. The flow of carrier gas remains the same, but the flow of reactive fluid may be rerouted by opening and closing valves to purge a fluid circuit comprising a charge reservoir 102, which may be configured to contain and insert a precisely metered volume of reactive fluid into the carrier gas supplied to the reactor 100. Shortly after the circuit is purged, a valve may be closed to fill the charge reservoir 102 with a pre-designated volume and pressure of reactive fluid from the precursor supply 106 as illustrated in FIG. 9C. Once the pre-designated volume of reactive fluid is supplied to the charge reservoir 102, the volume of reactive fluid may be compressed with the carrier gas from the compression gas supply 108 and may precisely be matched to the pressure of the reactor zone 100 and the fluid circuit supplied by the push gas supply 104 as illustrated in FIG. 9D.

To provide the pulse of reactive fluid in the charge reservoir 102 to the reactor 100, the carrier gas flow from the push gas supply 104 may be rerouted by opening and closing the appropriate valves to direct the flow through the charge reservoir 102 to the reactor 100 as shown in FIG. 9E. The carrier gas carries the pulse of reactive fluid to the reactor 100 to the reaction zone where the reactive fluid may react with another reactive fluid.

It should now be appreciated that the foregoing processes may be repeated as needed to supply sequential pulses of reactive fluids to the reactor 100. Furthermore, the charge reservoir 102 may be filled to various levels, altering the volume concentration of reactive fluid pulses supplied into the reactor zone of the reactor 100. Also, a portion of the carrier gas from the push gas supply 104 may bypass the charge reservoir 102 to vary the amplitude or volumetric flow rate of the pulse.

The control system may also include a programmable controller, which actuates the valves in accordance with a programmable schedule. For example, the controller may provide control of the aforementioned parameters of pulse duration, pulse amplitude, and pulse separation.

Moreover, advanced real-time optical diagnostics (e.g., UV-VIS-IR, FTIR, Raman spectroscopies) may be integrated with the controller to provide real-time characterization data of the epitaxial films, as well as closed-loop feedback control data, as inputs to the controller. Such characterization processes and control methodologies are described generally in V. Woods and N. Dietz, *InN growth by high-pressures chemical vapor deposition: Real-time optical growth characterization*, Mater. Sci. & Eng. B 127(2-3) pp 239-250 (2006); I. P. Herman, *Optical Diagnositcs for thin Film Processing* (Academic Press Inc., New York, 1996); D. E. Aspnes and N. Dietz, *Optical Approaches for Controlling Epitaxial Growth*, Applied Surface Science 130-132 pp. 367-376 (1998); and N. Dietz, *Real-time optical Characterization of thin film growth*, Mater. Sci. & Eng. B87(1), pp. 1-22 (2001).

Having described the invention, the following examples are given to illustrate applications of the invention to the growth on indium-rich group III-nitride alloys. These specific examples and compositions are not intended to limit the scope to group III-nitrides or heterostructures. The methods, reactors, and control systems described herein may be applied to any material system where the partial pressures of the film alloy constituents largely differ, such as oxide based dielectrics or other compound semiconductors.

EXAMPLES

Example 1: Gas and Surface Reaction Chemistry Control

For the described HPCVD reactor, various absorption spectroscopic techniques, such as UV-Vis absorption spectroscopy, may be utilized to analyze the kinetics of gas phase constituents above the growth surface. Some analytical methods are described in greater detail in V. Woods and N. Dietz, *InN growth by high-pressures chemical vapor deposition: Real-time optical growth characterization*, Mater. Sci. & Eng. B 127(2-3) pp 239-250 (2006).

Figure 6:
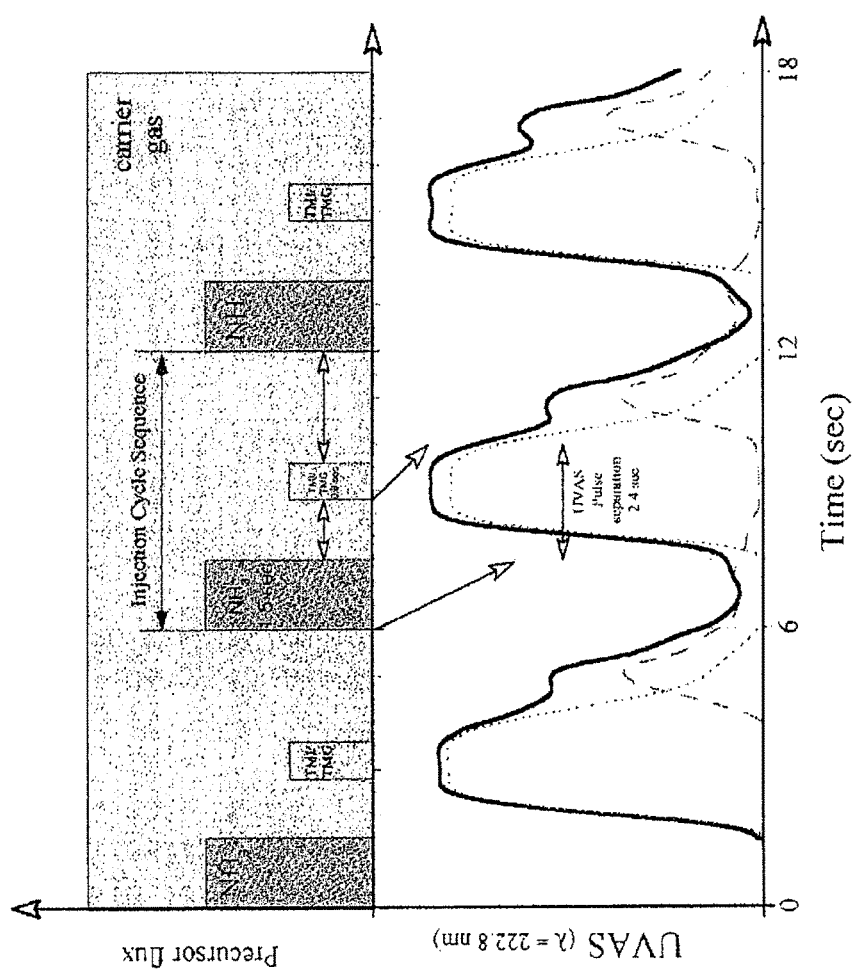
FIG. 6 is a graph, illustrating the real-time gas composition in the reaction zone monitored with ultra-violet visible (UV-Vis) absorption spectroscopy in comparison to a reactive fluid injection cycle according to one or more embodiments of the present invention.

FIG. 6 illustrates a representative reactive fluid flux injection scheme used during InGaN growth and the real-time UV-Vis absorption trace monitored above the growth surface at 222.8 nm during steady-state InGaN growth conditions. In this example, the TMI and TMG reactive fluids were injected simultaneously.

The top portion of the graph illustrates the precursor flux of the reactive fluids and carrier gas with respect to time. As illustrated in this graph, the total volumetric flow rate through the reactor remained constant throughout the injection cycle sequences. Three injection cycles are shown. Each cycle began with a pulse of $NH_3$ embedded in the carrier gas. The width of the pulse represents the duration of the pulse (in this example, 1.5 seconds), and the area within pulse represents the total volume of the $NH_3$ embedded in the carrier gas. The pulse of $NH_3$ was followed by a period of time when only carrier gas was injected into the reactor. Shortly thereafter, a pulse of second reactive fluids, TMI and TMG, was injected into the carrier gas. The duration between the pulses of $NH_3$ and TMI/TMG may be referred to as the pulse separation. A second pulse separation was provided between the injection of the TMI/TMG and the next pulse of $NH_3$. The next injection of $NH_3$ marked the start of a new injection cycle.

The bottom portion of the graph of FIG. 6 illustrates a UV-absorption trace in real-time at a wavelength where the reactive fluids show characteristic absorption (in this example, $\lambda_{max}$=222.8 nm). The reactive fluid arrival above the growth surface can be observed in the UV-Vis trace and correlated to each reactive fluid constituent. The control of the injection sequence in the top portion of the graph utilizing the real-time UV-Vis trace analysis enables the precise engineering of gas phase and surface reactions, an essential tool to optimize the process conditions. Adjusting the pulse separations between the reactive fluids as well as the length of each reactive fluid pulse may be used as process control parameters to optimize the growth conditions.

Figure 7:
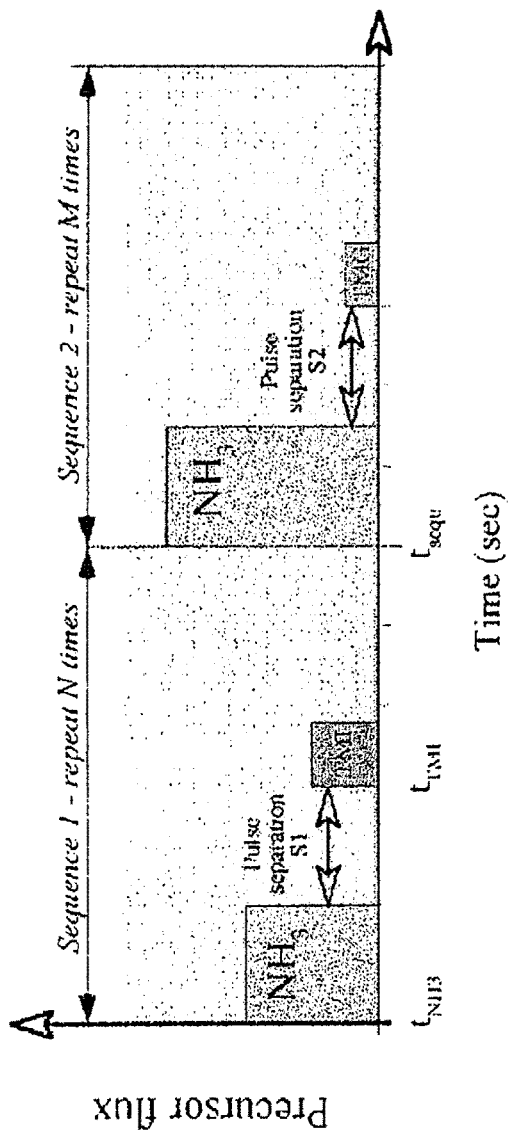
FIG. 7 is a graph, illustrating an injection scheme in which trimethylindium (TMI) and trimethylgallium (TMG) precursors are injected at different times according to one or more embodiments of the present invention.

As illustrated in FIG. 7, TMI and TMG may be injected as separate pulses to provide yet another process control parameter. Separate pulse injection may be particularly beneficial to the growth of ternary alloys such as InAlGaN. In particular, such growth schemes may be employed for tertiary InGaN alloy formation, for the control of phase segregations, as well as to compensate for the different TMI and TMG growth chemistries on a sub-monolayer level. For example, each sequence may be uniquely tailored to the gas and surface chemistry of the alloy formed, e.g., each sequence can have a unique timing for pulse separations. Also, by adjusting the precursor pulse lengths, each sequence can have a unique group V/III reactive fluid ratio that is tailored to the specific partial pressures. Each of the sequences may be repeated numerous times in order to deposit a specific amount of material to engineer the material composition targeted, and may further be adjusted to compensate for the materials alloying/intermixing process, the phase segregation process in dissimilar materials, or the formation of 2- and 3-dimensional nano-composites, quantum dots, or quantum wells.

Example 2: InGaN Growth by HPCVD

Figure 8:
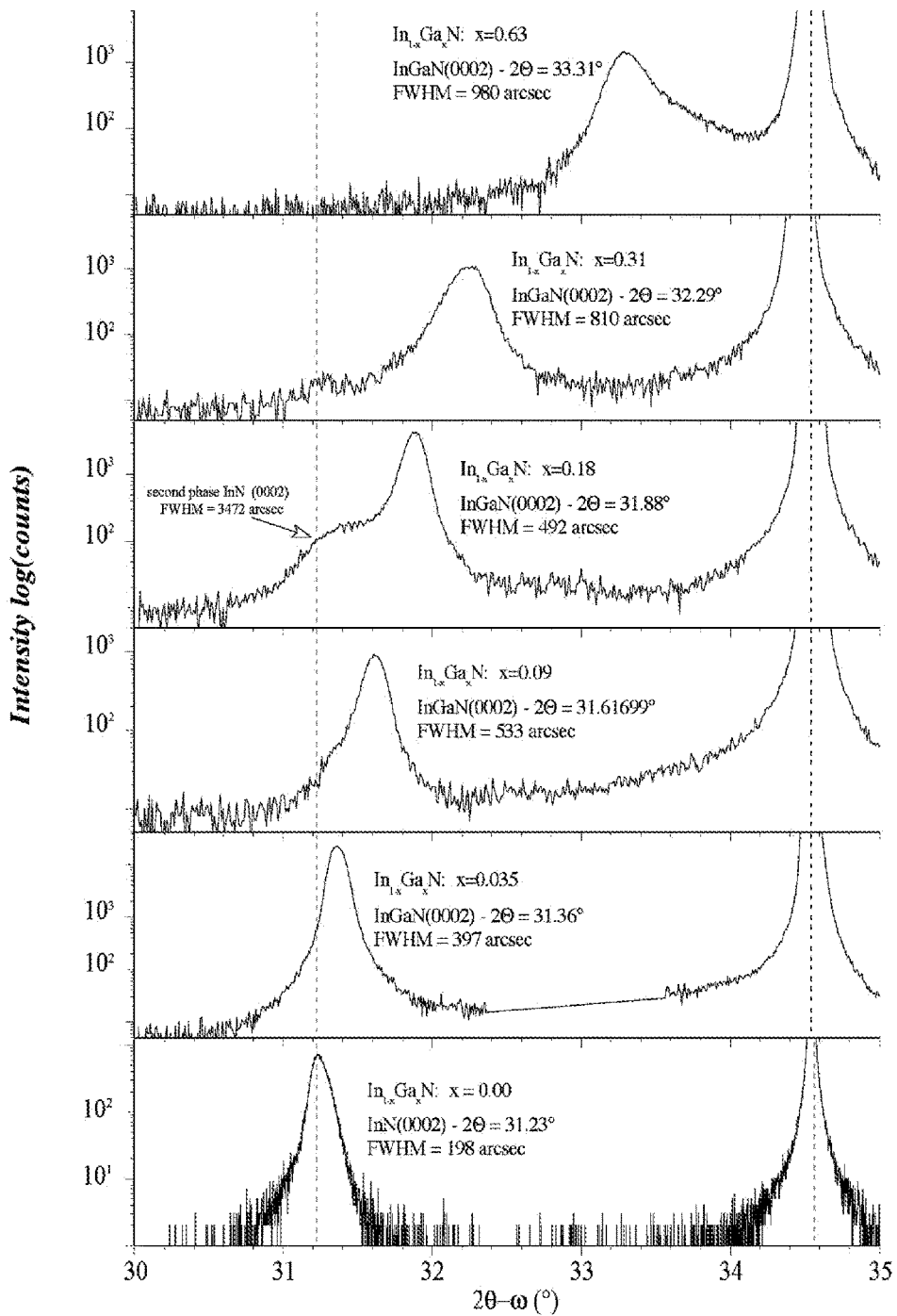
FIG. 8 is an X-ray diffraction graph, illustrating $In_{1-x}Ga_xN$ films of varying compositions (x=0.00, 0.04, 0.09, 0.18, 0.31 and 0.63) according to one or more embodiments of the present invention.

Initial results on the structural properties of $In_{1-x}Ga_xN$ layers grown by HPCVD are illustrated in FIG. 8. FIG. 8 depicts X-ray diffraction (XRD) results of $In_{1-x}Ga_xN$ layers grown at the same growth temperature and at a reactor pressure of 15 bar. The gallium composition was varied from x=0.0, 0.04, 0.09, 0.18, 0.31 and 0.63. The growth temperature was kept constant for x-values smaller than x=0.4 and were increased by 50° C. for x=0.63. The position and full-width-half-maximum (FWHM) of the InGaN (0002) Bragg reflex is a measure for composition and the structural quality of the grown layers. As used herein, "structural quality" refers to the crystalline perfection of the epitaxial layers, as measured by the FWHM. For LEDs, good structural quality is represented by an FWHM of less than about 200 arcseconds. For LDs, good structural quality is represented by an FWHM of less than about 50 arcseconds. The binary InN alloy (x=0.0) had a InN(0002) Bragg reflex with a FWHM of below 200 arcseconds, a value similar to those reported for MBE grown layers and suitable for use in LEDs. As shown in FIG. 7, with increasing incorporation of Gallium the InGaN(0002) Bragg reflex shifted to higher 2Θ values (shrinkage of lattice constant) and an increase in the FWHM of the Bragg reflex was observed.

For gallium concentrations in the range of x=0.1 to x=0.30, two Bragg reflexes were observed, indicating the existence of distinct phases with different compositions. However, InGaN layers in the same compositional ranges grown on a sapphire substrate showed single phase behavior, as indicated by the InGaN(0002) Bragg reflex.

Example 3: Reactor Pressure Versus Growth Temperature Relationship

Figure 10:
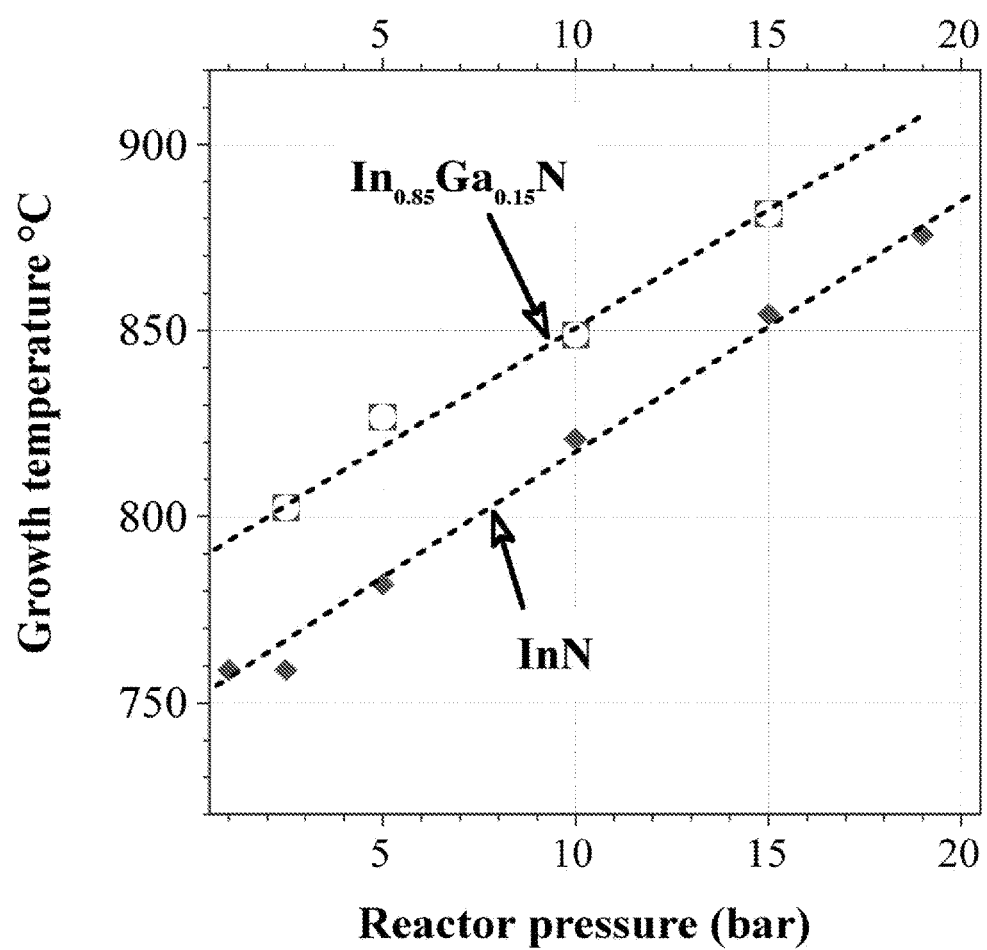
FIG. 10 is a graph, illustrating the growth temperature vs. pressure of InN and $In_{1-x}Ga_xN$, according to one or more embodiments of the present invention.

Initial results on the relationship between growth temperature and reactor pressure for InN and $In_{0.85}Ga_{0.15}N$ are illustrated in FIG. 10. As depicted in FIG. 10, the potential growth temperature for InN can be increased by approximate 6.6° C./bar, which leads to an InN growth temperature of approximate 880° C. at 20 bar reactor pressure. For $In_{1-x}Ga_xN$ with x=0.15, the slope (represented by the increase in growth temperature as a linear function of the increase in pressure) decreases slightly to about 6.0° C./bar. The increase in growth temperature with reactor pressure depicted in FIG. 10 demonstrate the benefit of HPCVD for the growth of $In_{1-x}Ga_xN$ device structures which have to integrate $In_{1-x}Ga_xN$ epilayers within a wide compositional range x.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A reactor apparatus comprising:
   an enclosure capable of confining super-atmospheric pressure;
   a substrate carrier adapted to hold a substrate in a reaction zone within the reactor apparatus, the substrate having a growth surface for growing epitaxial layers;
   a flow channel adapted to direct flow of a first set of reactive fluids along a first direction of flow over the growth surface; and
   an injector adjacent to the reaction zone adapted to inject a second set of reactive fluids into the reaction zone in a direction substantially perpendicular to the first direction of flow such that the second set of reactive fluids is injected into the reaction zone above the growth surface and reacts with the first set of reactive fluids or decomposes to deposit a film of reacted product on the growth surface, wherein the injector comprises a distribution block having a plurality of conduits passing therethrough.

2. The reactor apparatus of claim 1, wherein the epitaxial layers comprise:
   a first epitaxial layer comprising a first group III-nitride alloy; and
   a second epitaxial layer comprising a second group III-nitride alloy,
   wherein the first group III-nitride alloy is an alloy that decomposes at ambient atmospheric pressure at a minimal temperature at which the second group III-nitride alloy deposits at ambient atmospheric pressure, and
   wherein the first group III-nitride alloy is an alloy that will not decompose at a super-atmospheric pressure and a temperature at which the second group III-nitride alloy deposits.

3. The reactor apparatus of claim 1, wherein the substrate carrier is adapted to hold the substrate in a first plane substantially parallel to the first direction of flow.

4. The reactor apparatus of claim 1, wherein the injector is adapted to distribute the second set of reactive fluids evenly across the growth surface.

5. The reactor apparatus of claim 1, wherein the injector comprises a porous material.

6. The reactor apparatus of claim 1, wherein the injector is adapted to direct reactive fluids to the reaction zone or to the growth surface.

7. The reactor apparatus of claim 1, wherein one of the injector or the flow channel is fluidly connected to a group V reactive fluid source.

8. The reactor apparatus of claim 7, wherein an alternate one of the injector or the flow channel fluidly is connected to a group III reactive fluid source.

9. The reactor apparatus of claim 1, further comprising a controller adapted to embed the first set of reactive fluids as a pulse into a continuous feed of carrier gas for transport to the reaction zone along the first direction of flow, the pulse having a temporally and spatially concentrated distribution of the first set of reactive fluids within the continuous feed.

10. The reactor apparatus of claim 1, further comprising a device adapted to rotate the substrate carrier.

11. The reactor apparatus of claim 1, further comprising a first heating element upstream of the substrate to heat the first set of reactive fluids.

12. The reactor apparatus of claim 1, further comprising a second heating element to heat the second set of reactive fluids prior to injection into the reaction zone.

* * * * *